(12) United States Patent
Park

(10) Patent No.: US 11,408,914 B2
(45) Date of Patent: Aug. 9, 2022

(54) MEMS PROBE AND TEST DEVICE USING THE SAME

(71) Applicant: LEENO INDUSTRIAL INC., Busan (KR)

(72) Inventor: Ung-gi Park, Seoul (KR)

(73) Assignee: LEENO INDUSTRIAL INC.

( * ) Notice: Subject to any disclaimer, the term of this patent is extended or adjusted under 35 U.S.C. 154(b) by 0 days.

(21) Appl. No.: 16/108,214

(22) Filed: Aug. 22, 2018

(65) Prior Publication Data

US 2019/0064215 A1 Feb. 28, 2019

(30) Foreign Application Priority Data

Aug. 23, 2017 (KR) .................. 10-2017-0106770

(51) Int. Cl.
| | | |
|---|---|---|
| *G01R 1/067* | (2006.01) | |
| *H01R 13/03* | (2006.01) | |
| *H01R 13/24* | (2006.01) | |
| *G01R 1/073* | (2006.01) | |

(Continued)

(52) U.S. Cl.
CPC ..... *G01R 1/06716* (2013.01); *G01R 1/07314* (2013.01); *G01R 1/07342* (2013.01); *G01R 31/2886* (2013.01); *H01R 13/03* (2013.01); *H01R 13/2407* (2013.01);
(Continued)

(58) Field of Classification Search
CPC .................................................. G01R 1/06716
See application file for complete search history.

(56) References Cited

U.S. PATENT DOCUMENTS

| | | |
|---|---|---|
| 5,952,843 A | 9/1999 | Vinh |
| 2011/0316576 A1 | 12/2011 | Kataoka et al. |
| 2014/0118016 A1 | 5/2014 | Breinlinger et al. |

(Continued)

FOREIGN PATENT DOCUMENTS

| | | | |
|---|---|---|---|
| CN | 101294983 A | * | 10/2008 |
| CN | 101294983 A | | 10/2008 |

(Continued)

OTHER PUBLICATIONS

Chinese Office Action (CN 201810960590.0), CNIPA, dated Jun. 8, 2020.

(Continued)

*Primary Examiner* — Noam Reisner
(74) *Attorney, Agent, or Firm* — Park & Associates IP Law, P.C.

(57) ABSTRACT

A microelectromechanical system (MEMS) probe for electric connection between a tested contact point of an object to be tested and a testing contact point of a test circuit. The MEMS probe includes: a first terminal contact portion; a second terminal contact portion movable close to and away from the first terminal contact portion; and an elastic connecting portion connecting the first terminal contact portion and the second terminal contact portion, elastically deformed by an approach of the second terminal contact portion and comprising a plurality of plating layers stacked in the elastic deformation direction. According to the present disclosure, the MEMS probe includes a plurality of plating layers stacked in the elastic deformation direction, thereby decreasing fatigue failure and improving durability.

5 Claims, 5 Drawing Sheets

(51) Int. Cl.
*H01R 43/16* (2006.01)
*G01R 31/28* (2006.01)

(52) U.S. Cl.
CPC ......... *H01R 13/2471* (2013.01); *H01R 43/16* (2013.01); *H01R 2201/20* (2013.01)

(56) References Cited

U.S. PATENT DOCUMENTS

| | | | | |
|---|---|---|---|---|
| 2015/0280345 A1* | 10/2015 | Kimura | .............. | H01R 13/2428 439/700 |
| 2015/0355235 A1* | 12/2015 | Hsu | .................... | G01R 1/07314 324/755.04 |
| 2018/0024166 A1 | 1/2018 | Acconcia et al. | | |

FOREIGN PATENT DOCUMENTS

| | | |
|---|---|---|
| CN | 104755943 A | 7/2015 |
| JP | 2011-039066 A | 2/2011 |
| KR | 10-1173900 B1 | 8/2012 |
| KR | 10-1712367 B1 | 3/2017 |
| TW | 201027079 A | 7/2010 |
| TW | 201107758 A | 3/2011 |
| TW | 201640123 A | 11/2016 |
| WO | 2014070788 A1 | 5/2014 |

OTHER PUBLICATIONS

Chinese Office Action (CN 201810960590.0), CNIPA, dated Oct. 9, 2021.

* cited by examiner

MEMS PROBE AND TEST DEVICE USING THE SAME

REFERENCE TO RELATED APPLICATIONS

This application claims the priority benefit of Korean Patent Application No. 10-2017-0106770 filed on Aug. 23, 2017, the entire contents of which are incorporated herein by reference.

FIELD OF THE INVENTION

The present disclosure relates to a microelectromechanical system (MEMS) probe and a test device using the same for testing electric characteristics of a semiconductor or the like object to be tested.

BACKGROUND OF THE INVENTION

As a test device for testing electric characteristics or adequacy of a semiconductor wafer or the like object to be tested, a probe card has been used including a plurality of probes for electrical connection between a terminal of the object to be tested and a terminal of a test circuit board, and a probe supporter for supporting these probes.

With development of technology, the semiconductor wafer has become larger and a semiconductor has become smaller. According as the number of semiconductor pads formable on one sheet of semiconductor wafer increases, a distance between the semiconductor pads has to get closer. Like this, a higher-density probe card is required as a pitch becomes narrower.

In general, the probe card has employed a cantilever probe, a vertical probe, a microelectromechanical system (MEMS) probe, or the like. The cantilever type has disadvantages that all processes are modified and performed one by one by a human, but requires less production costs than the MEMS or vertical type. However, it is complicated because a human has to arrange pins again one by one under a situation that needs repair or maintenance.

The MEMS or vertical type couples the MEMS probes by means of a precision instrument, which increases production costs but considerably improves precision.

FIG. 1 shows a conventional MEMS probe 10. As shown therein, the MEMS probe 10 includes a first terminal contact portion 12 and a second terminal contact portion 14 to be respectively in contact with a terminal of an object to be tested and a terminal of a test circuit board, and a previously curved elastic deformation portion 16 for connection between the first and second terminal contact portions 12 and 14. In this case, the MEMS probe 10 includes a plurality of plating layers 10A, 10B, 10C, 10D and 10E stacked in a direction perpendicular to an elastic deformation direction of the elastic deformation portion 16. However, the plurality of plating layers 10A, 10B, 10C, 10D and 10E stacked in the direction perpendicular to the elastic deformation direction has a problem of the interface delamination due to motion stress as the tests are carried out many times. As a result, the MEMS probe having the plurality of plating layers stacked in the direction perpendicular to the elastic deformation direction is deteriorated in durability due to interface delamination.

SUMMARY OF THE INVENTION

An aspect of the present disclosure is conceived to solve the conventional problems and provide an MEMS probe and a test device using the same, which prevents a plurality of plating layers from interface delamination during a test and improves durability.

In accordance with an embodiment of the present disclosure, there is provided a MEMS probe for electric connection between a tested contact point of an object to be tested and a testing contact point of a test circuit. The MEMS probe includes: a first terminal contact portion; a second terminal contact portion movable close to and away from the first terminal contact portion; and an elastic connecting portion connecting the first terminal contact portion and the second terminal contact portion, elastically deformed by an approach of the second terminal contact portion and comprising a plurality of plating layers stacked in the elastic deformation direction. According to the present disclosure, the MEMS probe includes a plurality of plating layers stacked in the elastic deformation direction, thereby decreasing fatigue failure and improving durability.

The elastic connecting portion may be curved along a curved path and elastically connect the first terminal contact portion and the second terminal contact portion, and the plurality of plating layers are stacked along a curved plane including the curved path.

The plurality of plating layers may include an elastic plating layer, and a conductive plating layer having a lower elastic coefficient and higher electric conductivity than the elastic plating layer.

The plurality of plating layers may include an insulation coating layer at an outmost side.

In accordance with an embodiment of the present disclosure, there is provided a method of fabricating a MEMS probe. The method includes stacking and plating a probe main body of a plurality of layers shaped like a flat plate; subjecting the probe main body of the plurality of layers to primary heat treatment; press-forming a middle portion of the probe main body subjected to the primary heat treatment to be curved in a stacking direction; and subjecting the curved probe main body to secondary heat treatment.

In accordance with an embodiment of the present disclosure, there is provided a test device for testing electric characteristics of an object to be tested. The test device includes a first support member having a plurality of guide holes; a second support member having a plurality of terminal holes and spaced apart in parallel from the first supporting member; and a plurality of MEMS probes each comprising a first terminal contact portion inserted in the guide hole of the first support member and supported to slide and move in a testing direction, a second terminal contact portion supported in the terminal hole of the second support member, and an elastic connecting portion elastically deformed between the first terminal contact portion and the second terminal contact portion and comprising a plurality of plating layers stacked in the deformation direction.

BRIEF DESCRIPTION OF THE DRAWINGS

The above and/or other aspects will become apparent and more readily appreciated from the following description of exemplary embodiments, taken in conjunction with the accompanying drawings, in which.

DETAILED DESCRIPTION OF THE INVENTION

Below, embodiments of the present disclosure will be described in detail with reference to the accompanying drawings.

Figure 2:
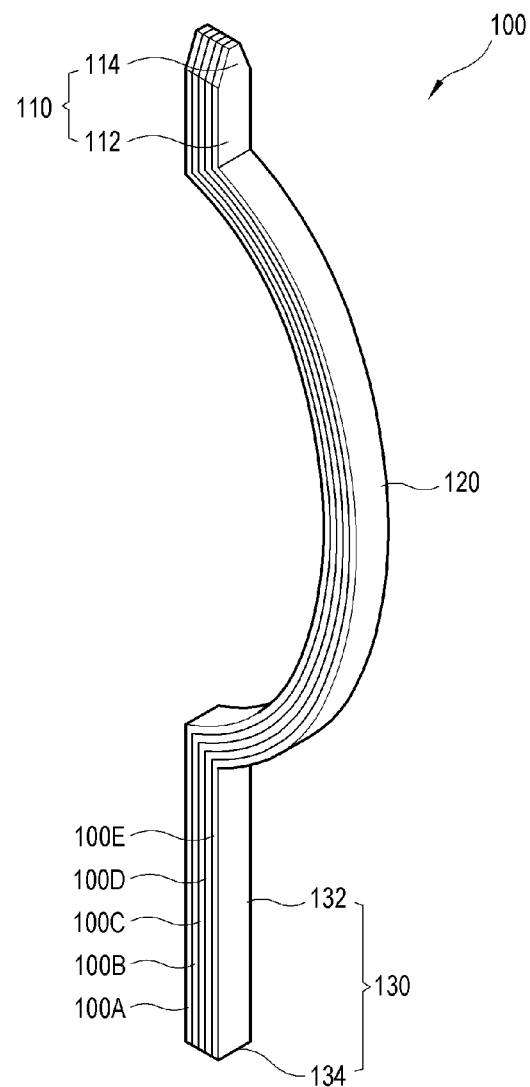
FIG. 2 is a perspective view of an MEMS probe according to a first embodiment of the present disclosure.

FIG. 2 is a perspective view of an MEMS probe 100 according to one embodiment of the present disclosure. As shown therein, the MEMS probe 100 is made of a conductive material, and electrically connects a bump terminal 12 of an object 10 to be tested and a pad terminal 22 of a test circuit board or interposer 20. The MEMS probe 100 may be used for electrically connecting two certain contact points as well as the object 10 to be tested and the test circuit board 20. Below, it will be described by way of example that the MEMS probe 100 is used for connection between the object 10 to be tested and the test circuit board 20.

The MEMS probe 100 includes a terminal contact portion 110 to be in contact with the pad terminal 22 of the test circuit board 20, an elastic deformation portion 120 elastically deformed during a test, and a sliding contact portion 130 to be in contact with the bump terminal 12 of the object 10 to be tested.

The terminal contact portion 110 includes a terminal contact main body portion 112 extended to have a straight plate shape, and a first contact tip 114 tapered from the terminal contact main body portion 112 and having a pyramid shape to be in contact with the pad terminal 22 of the test circuit board 20.

The elastic deformation portion 120 is connected as a single body to the terminal contact portion 110 and shaped like a plate curved along a predetermined curved path. The elastic deformation portion 120 is elastically deformed and/or buckled in a curved direction when the sliding contact portion 130 moves toward the pad terminal 22. The elastic deformation portion 120 returns from the elastically deformed shape to an original shape when pressure applied to the sliding contact portion 130 is released.

The sliding contact portion 130 includes a sliding contact main body portion 132 connected as a single body to the elastic deformation portion 120 and shaped like a straight plate, and a second contact tip 134 to be in contact with the object 10 to be tested. The sliding contact portion 130 moves toward the terminal contact portion 110 while being in contact with and pressed against the object 10 to be tested during the test, thereby elastically deforming the elastic deformation portion 120. The sliding contact portion 130 moves away from the pad terminal 22 when the elastically deformed elastic deformation portion 120 is restored by releasing the contact pressure against the object 10 to be tested.

The MEMS probe 100 includes five plating layers 100A, 1008, 100C, 100D and 100E, but is not limited thereto. The five plating layers 100A, 1008, 100C, 100D and 100E are stacked in a thickness direction, i.e. along a curved plane including a curved path of the elastic deformation portion. In other words, the five plating layers 100A, 1008, 100C, 100D and 100E are stacked along an elastic deformation direction of the elastic deformation portion 120. The five plating layers 100A, 1008, 100C, 100D and 100E are provided by combination of a conductive plating layer having high conductivity and an elastic plating layer having an elastic coefficient higher than that of the conductive plating layer. Of course, all the five plating layers 100A, 1008, 100C, 100D and 100E may be provided as only either of the conductive plating layer or the elastic plating layer. Here, the conductive plating layer and the elastic plating layer are basically made of good conductive material, but may be different in elastic coefficient.

Figure 3:
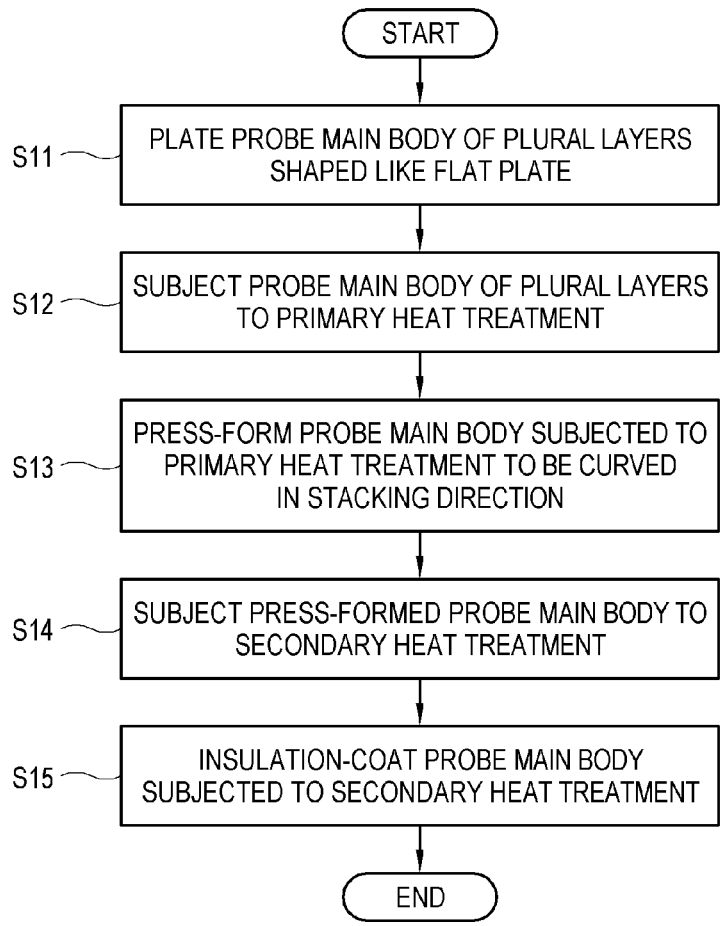
FIG. 3 is a flowchart of fabricating the MEMS probe of FIG. 2.

FIG. 3 is a flowchart of fabricating the MEMS probe 100 of FIG. 2.

At operation S11, for example, the conductive plating layer and the elastic plating layer are alternately stacked and plated as a flat plate shape, thereby forming a probe main body of a plurality of plating layer. A stacking and plating method includes a dip coating method, a chemical vapor deposition (CVD) method, an electro plating method, an electroless plating method, and an atomic layer deposition (ALD) method. The conductive plating layer and the elastic plating layer are made of gold (Au), platinum (Pt), silver (Ag), copper (Cu), aluminum (Al), iron (Fe), beryllium (Be), rhodium (Rh), palladium (Pd) alloy, nickel (Ni) alloy, aluminum oxide, graphene, graphene oxide, graphite, molybdenum disulfide, molybdenum disulfide metal or alloy thereof. For example, the conductive plating layer and the elastic plating layer may be adjusted in elastic coefficient by controlling palladium (Pd) alloy, nickel (Ni) alloy or the like content.

At operation S12, the probe main body including the plurality of plating layers undergoes strengthening heat treatment or annealing heat treatment to make press forming smooth.

At operation S13, the heat-treated probe main body is curved along a stacked direction at a middle portion corresponding to the elastic deformation portion by the press forming based on a precision mold.

At operation S14, the probe main body formed with the elastic deformation portion undergoes the strengthening heat treatment to secure elasticity.

At operation S15, the probe main body subjected to the strengthening heat treatment is coated with an insulation coating layer with regard to a whole or a specific portion, e.g. the elastic deformation portion or a topmost portion of the elastic deformation portion. The insulation coating layer is to prevent a short circuit between the adjacent MEMS probes when the plurality of MEMS probes 100 are very closely arranged in the test device 1.

The insulation coating layer also prevents the plurality of stacked plating layers from being damaged or oxidized at a lateral side, thereby improving the durability of the MEMS probe. The insulation coating includes diamond coating, Parylene coating, Teflon coating, oxide-film coating, etc.

Figure 4:
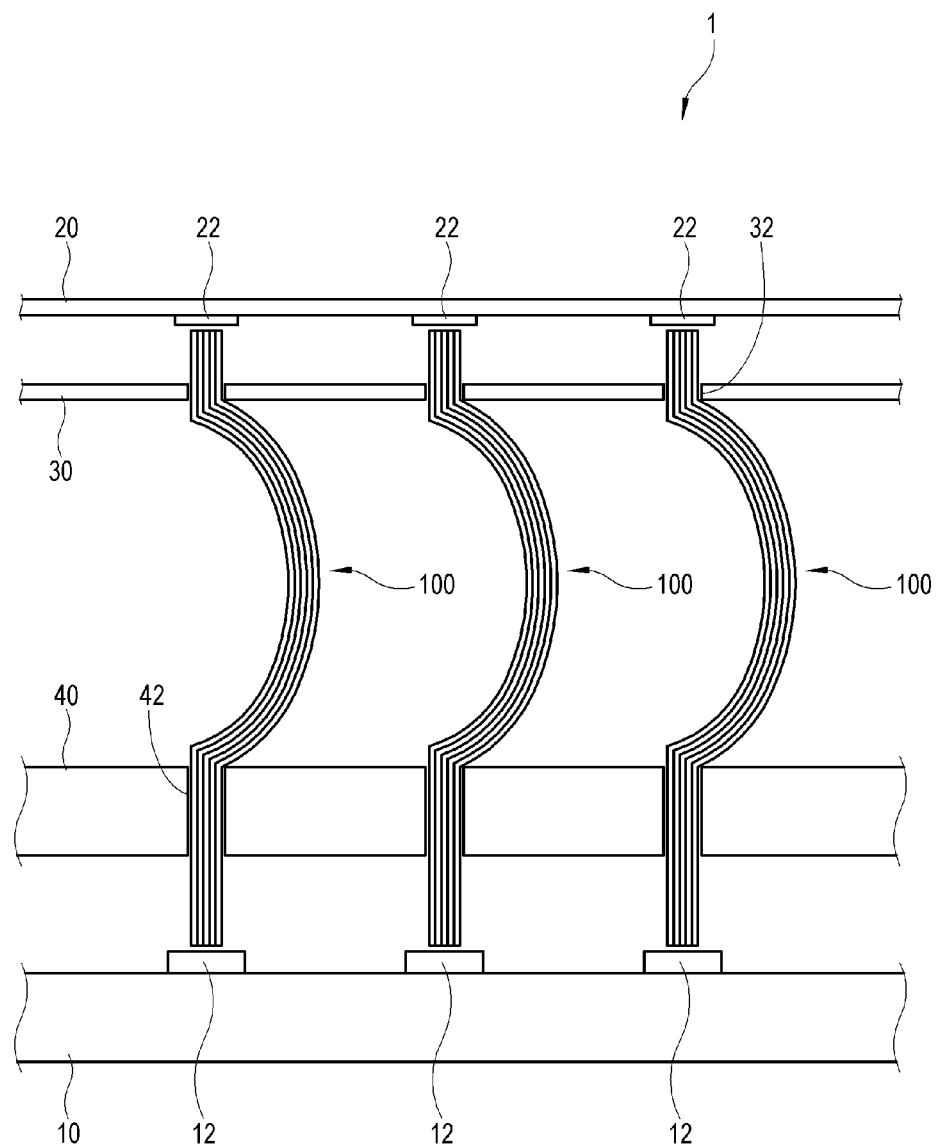
FIG. 4 is a cross-sectional view of a test device using the MEMS probe of FIG. 2.

FIG. 4 is a cross-sectional view of a test device 1 using the MEMS probe 100 according to the first embodiment of the present disclosure.

The test device 1 includes a first support member 30 having a plurality of terminal holes 32, a second support member 40 having a plurality of guide holes 42 and spaced apart in parallel from the first support member 30, and a plurality of MEMS probes 100 of which opposite ends are inserted in the terminal holes 32 and the guide hole 42.

The first support member 30 is provided as an insulating plate member and has the plurality of terminal holes 32 in which the terminal contact portions 110 of the MEMS probes 100 are inserted.

The second support member 40 is provided as an insulating plate member and has the plurality of guide holes 42 in which the sliding contact portions 130 are inserted while sliding to move close to and away from the terminal contact portion 110.

Figure 1:
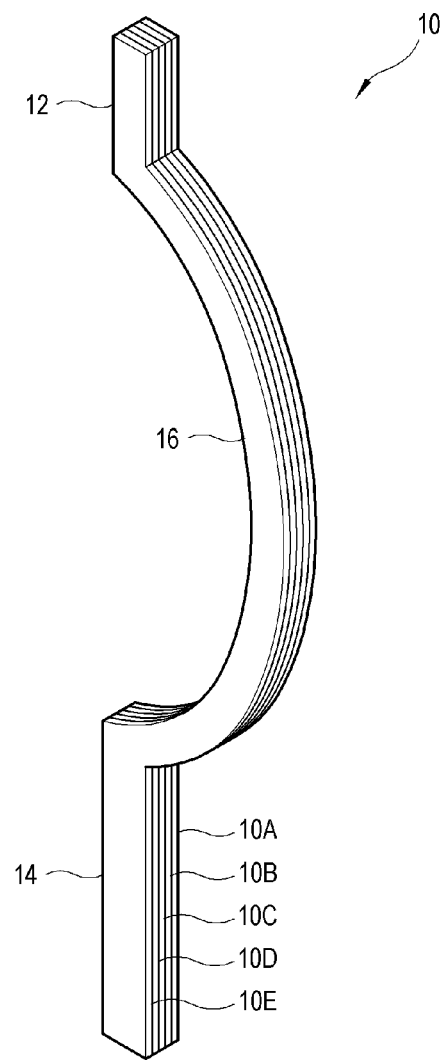
FIG. 1 is a perspective view of a conventional MEMS probe.

The MEMS probe 100 is the same as that shown in FIG. 1, and thus repetitive descriptions thereof will be avoided.

When the terminal pad 12 of the object 10 to be tested, for example, the semiconductor is in contact with and pressed against the end of the sliding contact portion 130 during the test, the sliding contact portion 130 slides and within the guide hole 42 and moves toward the terminal contact portion 110. The elastic deformation portion 120 is additionally deformed in the curved direction as the sliding contact portion 130 moves. In this case, motion stress is generated by the elastic deformation of the elastic deformation portion 120 in the staking direction of the plurality of plating layers, thereby decreasing motion load and preventing the plating layers from coming off.

Figure 5:
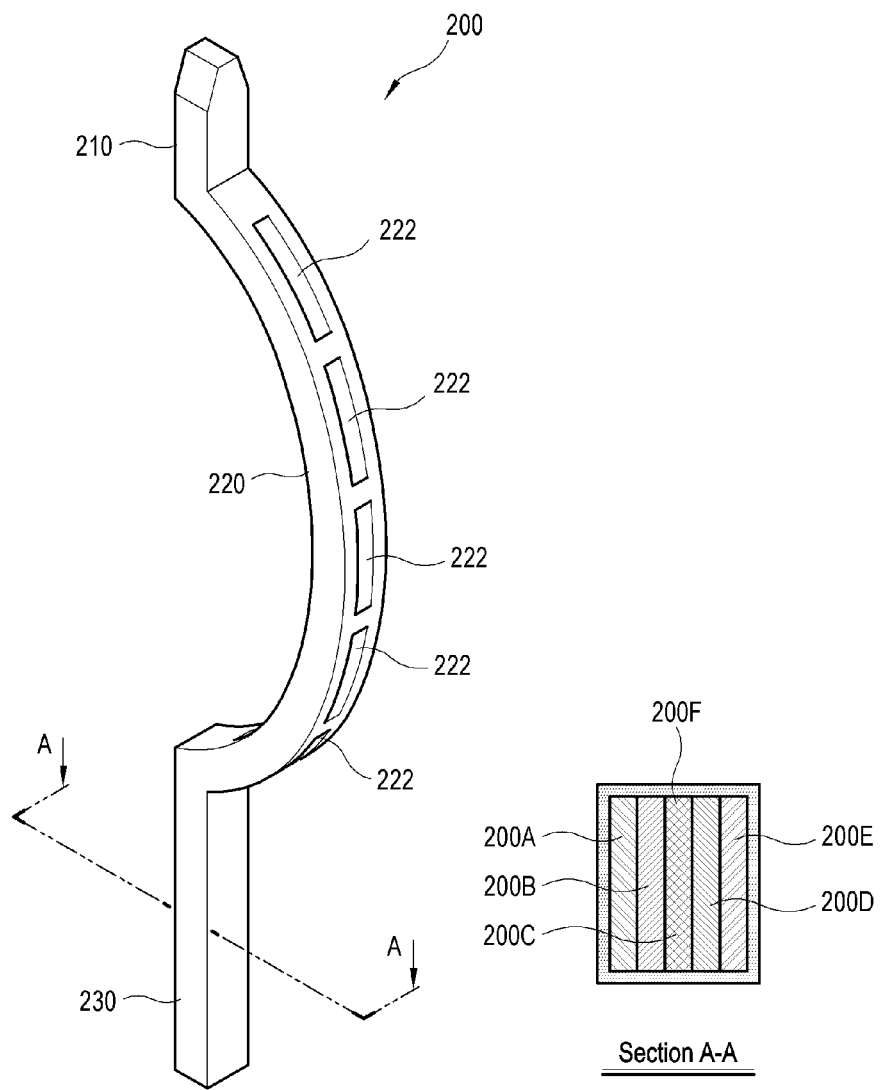
FIG. 5 is a perspective view of an MEMS probe according to a second embodiment of the present disclosure.

FIG. 5 is a perspective view of an MEMS probe 200 according to a second embodiment of the present disclosure. As shown therein, the MEMS probe 200 includes five plating layers 200A, 200B, 200C, 200D and 200E and an insulation coating layer 200F covering an outer side of the plating layers, but is not limited thereto. The five plating layers 200A, 200B, 200C, 200D and 200E are stacked in a thickness direction, i.e. along a curved plane including a curved path of an elastic deformation portion. In other words, the five plating layers 200A, 200B, 200C, 200D and 200E are stacked in an elastic deformation direction of the elastic deformation portion 220. The insulation coating layer 200F prevents a short-circuit between a plurality of adjacent MEMS probes 200 applied to the test device 1, and prevents the plurality of stacked plating layers from being damaged or oxidized at a lateral side, thereby improving the durability of the MEMS probe 200. The insulation coating layer 200F may be selectively coated on only the topmost layer 200E of the elastic deformation portion 230.

The MEMS probe 200 includes a terminal contact portion 210 to be in contact with the pad terminal 22 of the test circuit board 20, the elastic deformation portion 220 elastically deformed and/or buckled during a test, and a sliding contact portion 230 to be in contact with the bump terminal 12 of the object 10 to be tested. Below, descriptions of the terminal contact portion 210 and the sliding contact portion 230 will be omitted since they are the same as those of the MEMS probe 100 in FIG. 2.

The elastic deformation portion 220 includes at least one slit 222 formed along a lengthwise direction. The slit 222 makes the elastic deformation portion 220 be easily deformed and prevents durability from lowering due to excessive stress change. In particular, the conventional stacking method in the direction perpendicular to the deformation direction shown FIG. 1 is difficult to form the slit 222.

According to the present disclosure, the MEMS probe is fabricated being plated and stacked in the elastic deformation direction, thereby preventing the plurality of plating layers from interface delamination due to elastic deformation motion, and improving durability.

Although the present disclosure is described through a few exemplary embodiments and drawings, the present invention is not limited to the foregoing exemplary embodiments and it will be appreciated by a person having an ordinary skill in the art that various modifications and changes can be made from these embodiments.

Therefore, the scope of the present disclosure has to be defined by not the exemplary embodiments but appended claims and the equivalents.

REFERENCE NUMERALS

1: test device 10: object to be tested
20: test circuit board (interposer)
100, 200: MEMS probe 100A~100E: plating layer
100F: insulation coating layer
110, 210: terminal contact portion
120, 220: elastic deformation portion
130, 230: sliding contact portion
222: insulation coating layer.

What is claimed is:

1. A test probe for testing electric characteristics of an object, the test probe comprising:
a first terminal contact portion;
a second terminal contact portion disposed at a vertically opposite side from the first terminal contact portion; and
an elastic connecting portion extending between the first terminal contact portion and the second terminal contact portion, the elastic connecting portion having a preset curved or bent shape, the elastic connecting portion formed with a plurality of plating layers stacked in a curved deformation direction of the test probe with each face of the plating layers orienting toward the curved deformation direction, such that the elastic connecting portion is elastically deformed to the curved deformation direction when compression force is applied in a longitudinal direction of the test probe for testing the object,
wherein the plurality of plating layers are directly laminated on one another,
wherein the elastic connecting portion comprises an insulation coating layer at an outmost side of the plurality of plating layers.

2. The test probe according to claim 1, wherein the elastic connecting portion is formed with a plurality of elastic plating layers, and a plurality of conductive plating layers having a lower elastic coefficient and higher electric conductivity than the elastic plating layer, the elastic plating layers and the conductive plating layers stacked alternately.

3. A method of fabricating a test probe, the method comprising:
stacking and plating a probe main body of a plurality of layers shaped like a flat plate;
subjecting the probe main body of the plurality of layers to primary heat treatment;
press-forming a middle portion of the probe main body subjected to the primary heat treatment to be curved in a stacking direction; and
subjecting the curved probe main body to secondary heat treatment.

4. A test device for testing electric characteristics of an object, the test device comprising:
a first support member having a plurality of guide holes;
a second support member having a plurality of terminal holes and spaced apart in parallel from the first supporting member; and
a plurality of test probes each comprising a first terminal contact portion inserted in the guide hole of the first support member and supported to slide and move in a testing direction, a second terminal contact portion disposed at a vertically opposite side from the first terminal contact portion and supported in the terminal hole of the second support member, and an elastic connecting portion extending between the first terminal contact portion and the second terminal contact portion and comprising a plurality of plating layers stacked in a curved deformation direction of the test probe with each face of the plating layers orienting toward the curved deformation direction, such that the elastic connecting portion is elastically deformed to the curved deformation direction when compression force is applied in a longitudinal direction of the test probe for testing the object, wherein the plurality of plating layers are directly laminated on one another, wherein the elastic connecting portion comprises an insulation coating layer at an outmost side of the plurality of plating layers.

5. A test probe for testing electric characteristics of an object, the test probe comprising:

a first terminal contact portion;

a second terminal contact portion disposed at a vertically opposite side from the first terminal contact portion; and an elastic connecting portion extending between the first terminal contact portion and the second terminal contact portion, the elastic connecting portion having a preset curved or bent shape, the elastic connecting portion formed with a plurality of plating layers stacked in a curved deformation direction of the test probe with each face of the plating layers orienting toward the curved deformation direction, such that the elastic connecting portion is elastically deformed to the curved deformation direction when compression force is applied in a longitudinal direction of the test probe for testing the object, wherein the plurality of plating layers are directly laminated on one another, wherein the elastic connecting portion is formed with a plurality of elastic plating layers, and a plurality of conductive plating layers having a lower elastic coefficient and higher electric conductivity than the elastic plating layer, the elastic plating layers and the conductive plating layers stacked alternately.

* * * * *